(12) United States Patent
Archie et al.

(10) Patent No.: US 7,688,456 B2
(45) Date of Patent: *Mar. 30, 2010

(54) ASSESSMENT AND OPTIMIZATION FOR METROLOGY INSTRUMENT

(75) Inventors: Charles N. Archie, Granite Springs, NY (US); G. William Banke, Jr., Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 116 days.

This patent is subject to a terminal disclaimer.

(21) Appl. No.: 12/021,356

(22) Filed: Jan. 29, 2008

(65) Prior Publication Data

US 2008/0140342 A1 Jun. 12, 2008

Related U.S. Application Data

(63) Continuation of application No. 10/524,286, filed as application No. PCT/US02/41180 on Dec. 20, 2002, now Pat. No. 7,352,478.

(51) Int. Cl.
*G01B 11/14* (2006.01)
(52) U.S. Cl. ..................... 356/625; 700/121
(58) Field of Classification Search ......... 356/625–636; 702/85, 118, 182–185, 179; 700/121
See application file for complete search history.

(56) References Cited

U.S. PATENT DOCUMENTS

| | | | |
|---|---|---|---|
| 5,835,227 A | 11/1998 | Grodnensky et al. | |
| 6,055,045 A | 4/2000 | Weill et al. | |
| 7,286,247 B2 * | 10/2007 | Archie et al. | 356/625 |
| 7,352,478 B2 * | 4/2008 | Archie et al. | 356/625 |
| 7,353,128 B2 * | 4/2008 | Archie et al. | 702/85 |
| 7,453,583 B2 * | 11/2008 | Archie et al. | 356/625 |
| 2005/0222804 A1 | 10/2005 | Archie et al. | |
| 2006/0132749 A1 | 6/2006 | Bruls et al. | |
| 2006/0184334 A1 * | 8/2006 | Sendelbach | 702/127 |
| 2006/0195294 A1 * | 8/2006 | Archie et al. | 702/179 |
| 2008/0033692 A1 * | 2/2008 | Archie et al. | 702/179 |

(Continued)

FOREIGN PATENT DOCUMENTS

JP 10-260108 9/1998

OTHER PUBLICATIONS

Ichiko Misumi, et al., Calibration of 1-D Grating with Nanometrological AFM(2nd report), Uncertainty of measurement, Autumn Meeting of The Japan Society for Precision Engineering 2001, Technical Meeting Lecture Papers, 2001, p. 475—Japanese only—no English abstract available.

(Continued)

*Primary Examiner*—Hoa Q Pham
(74) *Attorney, Agent, or Firm*—Ian MacKinnon; Hoffman Warnick LLC

(57) ABSTRACT

Methods and related program product for assessing and optimizing metrology instruments by determining a total measurement uncertainty (TMU) based on precision and accuracy. The TMU is calculated based on a linear regression analysis and removing a reference measuring system uncertainty ($U_{RMS}$) from a net residual error. The TMU provides an objective and more accurate representation of whether a measurement system under test has an ability to sense true product variation.

10 Claims, 10 Drawing Sheets

U.S. PATENT DOCUMENTS

2009/0063077 A1 * 3/2009 Liu et al. .................. 702/82

OTHER PUBLICATIONS

Tomizo Kurosawa, Standards and Their International Comparisons on Nanometrology, Journal of The Japan Society for Precision Engineering, Mar. 5, 2002, vol. 68, No. 3, pp. 338-341—Japanese only—no English abstract available.

Bill Banke, et al., Characteristics of accuracy for CD metrology, Proc SPIE Int Soc Opt Eng, 1999, Vol. 3677, pp. 291-308.

* cited by examiner

US 7,688,456 B2

ASSESSMENT AND OPTIMIZATION FOR METROLOGY INSTRUMENT

This application is a continuation of U.S. Ser. No. 10/524,286, now U.S. Pat. No. 7,352,478, filed Feb. 10, 2005, which is a National Stage filing of PCT/US2002/041180, filed Dec. 20, 2002.

TECHNICAL FIELD

The present invention relates generally to metrology instruments.

BACKGROUND ART

Efficient semiconductor manufacturing requires highly precise and accurate metrology instruments. In particular, a metrology instrument is required to achieve small tolerances to achieve better quality products and fewer rejections in the manufacturing process. For example, the 1999 Edition of the International Technology Roadmap for Semiconductors lists the necessary precision needed for isolated line control in the year 2001 to be 1.8 nm. Unfortunately, correctly assessing and optimizing the measurement potential of a metrology instrument is difficult for a number of reasons. For example, an evaluator normally has limited access to the various instruments under consideration. In addition, each instrument needs to be evaluated under a wide range of conditions in order to gain a valid impression of how it will perform in the actual manufacturing setting. Finally, there are no widely accepted standards relative to the required parameters and how the parameters should be measured. As a result, an adequate solution for calculating an uncertainty of a metrology instrument in meaningful units of length for comparison to manufacturing lithography requirements has been elusive.

Current assessment methods are often based on the repeatability and reproducibility (R&R) of an instrument. For a critical dimension (CD) metrology instrument, evaluation is often executed by pulling representative samples of partially constructed product wafers from a manufacturing line. Recipes (programming instructions) are then implemented on an instrument under evaluation such that estimates of the static repeatability and long term reproducibility can be made. For example, to determine static repeatability for a measurement of a given product level, a recipe is implemented to cause the CD metrology instrument to navigate to a particular site on the wafer and then repeatedly measure the size of a given feature. The measurement repeatability is determined from the standard deviation of the acquired data. Long term reproducibility, also called precision, is determined in a similar way to static repeatability except that between each measurement the sample is removed from the instrument for an arbitrary length of time ranging from seconds to days. Unfortunately, the repeatability and reproducibility of a measurement is meaningless if the measurement is wrong. Accuracy must also be considered. The above-described methods do not evaluate the accuracy of an instrument apart from ensuring proper magnification by calibration with pitch standards. The reason, in part, that accuracy is not considered is that accepted accuracy standards are generally not available because the speed at which semiconductor technology advances usually makes any standard obsolete very quickly. The result of these methodologies is that a measurement system under test may be misleadingly denoted as trustworthy.

One proposed solution for metrology instrument assessment introduces new parameters related to accuracy in addition to precision. See Banke and Archie, "Characteristics of Accuracy for CD Metrology," Proceedings of SPIE, Volume 3677, pp. 291-308 (1999). This approach deviates from using standard product wafers as samples by, for example, constructing wafers referred to as focus and exposure matrix (FEM) wafers. In this methodology, the actual CD value is determined for various fields on the FEM by using a respected reference measurement system (RMS). Following this approach, the RMS values and measurements from the instrument under test are compared by a linear regression method that is valid for situations where both variables are subject to error. Use of the FEM wafers is advantageous because they provide examples of product variation that under normal manufacturing line circumstances may occur only after a considerable time has passed. Important parameters of this methodology include the regression slope, the average offset, and a "poorness-of-fit" parameter called nonlinearity. Despite the existence of this suite of parameters for repeatability, reproducibility and accuracy, however, an evaluator must still determine, somewhat arbitrarily, how to combine these various parameters to assess or optimize an instrument.

In view of the foregoing, there is a need in the art for improved methods of assessing and optimizing metrology instruments.

DISCLOSURE OF THE INVENTION

The invention relates to methods for assessing and optimizing metrology instruments by determining a total measurement uncertainty (TMU) based on precision and accuracy. The TMU is calculated based on a linear regression analysis and removing a reference measuring system uncertainty ($U_{RMS}$) from a net residual error. The TMU provides an objective and more accurate representation of whether a measurement system under test has an ability to sense true product variation.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

BEST MODE(S) FOR CARRYING OUT THE INVENTION

The description includes the following headings for clarity purposes only: I. Data Analysis, II. Assessment Method, III.

Optimization Method, IV. Conclusion. It should be recognized that while particular types of measurement systems will be mentioned throughout the description that the teachings of the invention are applicable to any type of measurement system.

I. Data Analysis

Figure 1:
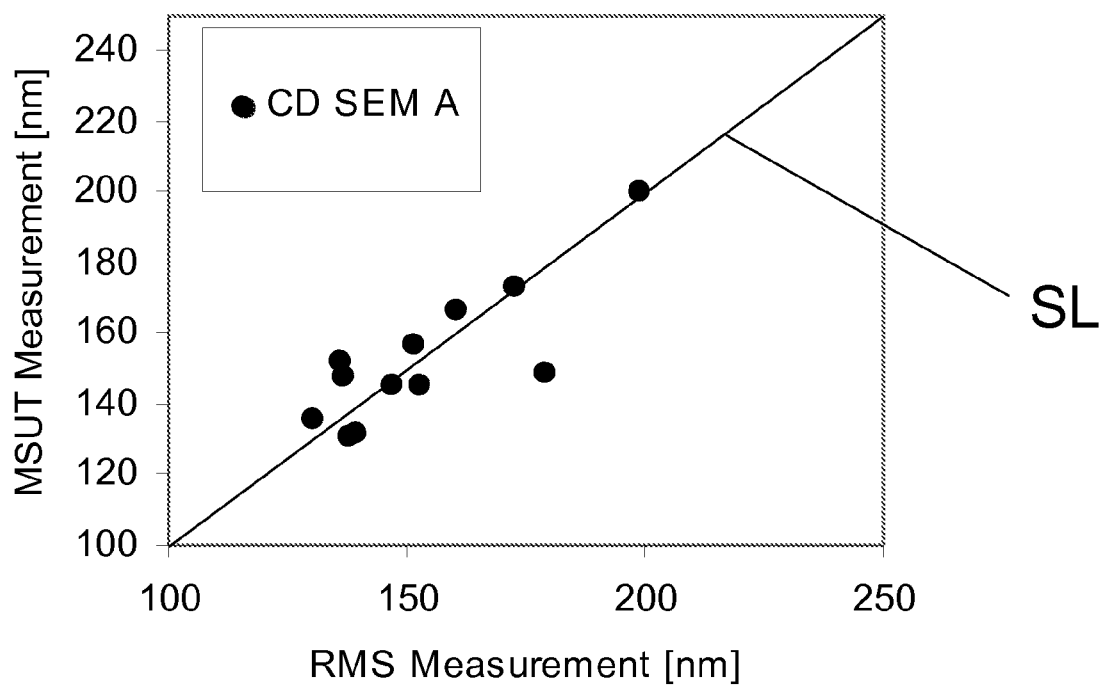
FIG. 1 shows a graph of data for a measurement system under test versus a reference measurement system.

In order to determine a total measurement uncertainty (hereinafter "TMU") of a measurement system under test (hereinafter "MSUT"), it is necessary to compare measurement data sets of a MSUT and a reference measurement system (hereinafter "RMS"). A conventional technique for comparing such data sets is linear regression derived by plotting the data sets against one another as shown in FIG. 1. The following data analysis is derived from the paper "Characteristics of Accuracy for CD Metrology," Proceedings of SPIE, Volume 3677, pp. 291-308 (1999) by Banke and Archie, which describes a form of linear regression upon which the invention draws. As used herein, precision shall be referred as a one sigma ($\sigma$) value.

When regressing one variable onto another an assumption is made about the relationship between the two variables. Referring to FIG. 1, it is assumed that a MSUT, e.g., a CD SEM, should behave linearly to the first order when compared to a set of reference standards, i.e., those from an RMS, e.g., a CD AFM. Such a model would be represented by a slope, $\beta$, and an intercept, $\alpha$, like the following equation:

$$y_i = \alpha + \beta x_i + \epsilon_i \quad (1)$$

where $y_i$ and $x_i$ represent the $i^{th}$ dependent and independent variables, respectively, and $\epsilon_i$ is the $i^{th}$ deviation, or residual, from the model. In terms of the metrology instrument assessment and optimization data analysis and methods, as discussed in more detail below, the independent variable x refers to the MSUT and the dependent variable y refers to the RMS.

The ordinary least-squares (hereinafter "OLS") fit is one type of general linear regression analysis, in which no error is assumed in the independent variable (MSUT). However, there are situations, especially in the case of semiconductor industry metrology applications, where this assumption is not valid. There are criteria that give some indication as to when, or under what conditions, it is permissible to use the OLS. One criterion is based upon the precision of the independent variable, $\sigma_x$, being small compared to the standard deviation of all the x values:

$$\frac{\sigma_{all \times values}}{\sigma_x} \gg 1 \quad (2)$$

Another criterion for acceptable use of the OLS fit is:

$$|\beta| \times \frac{\sigma_x}{\sigma_y} \ll 1 \quad (3)$$

If the estimated slope is approximately unity, it is easy to see that the precision in the independent measurement (MSUT) must be much smaller, or better, than the precision in the dependent variable (RMS) for the OLS to be valid. Perhaps most important in testing the accuracy of an unknown MSUT is the effect of the uncertainty in the reference standards on the resultant parameters that are used to assess this accuracy. To account for this, a method of linear regression that addresses errors in the y (RMS) and x (MSUT) variables and estimates the slope and intercept of the resultant best-fit line is necessary to fairly evaluate the accuracy of a measurement system.

The Mandel linear regression, as introduced in 1964 and revised in 1984 by John Mandel, provides a methodology of handling the least-squares fit when both variables are subject to error. One of the benefits of this more generalized regression analysis is that it can be used in all degrees of error in x and y, even the case when errors in x are zero, $\sigma_x$=0. One parameter affecting the Mandel method is a variable $\lambda$ (referred to herein as the "ratio variable"), which is defined by:

$$\lambda = \frac{\sigma_y^2}{\sigma_x^2} \quad (4)$$

where $\sigma_y$ and $\sigma_x$ are the precisions of the y (RMS) and x (MSUT) measurements, respectively. In the Mandel method, it is important to recognize that these precisions are based on replication only, not accuracy. According to the invention, the ratio variable $\lambda$ is re-defined as:

$$\lambda = \frac{U_{RMS}^2}{U_{MSUT}^2} \quad (5)$$

where $U_{RMS}$ is an RMS "uncertainty" defined as an RMS precision ($\sigma_{RMS}$) or an independently determined RMS total measurement uncertainty (TMU$_{RMS}$), and $U_{MSUT}$ is an MSUT "uncertainty" defined as a corrected precision of the MSUT or a TMU of the MSUT, as will be more fully described below. The TMU$_{RMS}$ can be determined using the methods as described herein applied to the RMS, i.e., treating the RMS as an MSUT. Unless denoted "TMU$_{RMS}$," "TMU" shall refer to the TMU for the MSUT.

The intent of the Mandel method is to start the analysis of the fitting procedure with some measure of the confidence level for each measurement. A key metric resulting from this regression is the slope of the best-fit line:

$$\hat{\beta} = \frac{S_{yy} - \lambda S_{xx} + \sqrt{(S_{yy} - \lambda S_{xx})^2 + 4\lambda S_{xy}^2}}{2S_{xy}} \quad (6)$$

where the $S_{xx}$, $S_{yy}$, and $S_{xy}$ are the sum of the squares from the raw data as defined by:

$$S_{xx} = \sum_{i=1}^{N} (x_i - \bar{x})^2,$$

$$S_{yy} = \sum_{i=1}^{N} (y_i - \bar{y})^2, \text{ and}$$

$$S_{xy} = \sum_{i=1}^{N} (x_i - \bar{x})(y_i - \bar{y}) \quad (7)$$

where N is the number of ordered pairs. In the general linear regression case, where OLS is valid, the uncertainty of the independent variable (MSUT) goes to zero and the ratio variable λ→∞. The estimate for the slope as the ratio variable λ approaches infinity is $S_{xy}/S_{xx}$ and when all the error is in the x (MSUT) measurement compared to the y (RMS) measurement, the ratio variable λ approaches zero and the estimate for the slope is $S_{yy}/S_{xy}$. This would be like regressing x onto y, which points out another feature of the Mandel method of regression. The analysis is symmetrical with the x and y variables such that it does not matter whether x is regressed on y, or y is regressed on x.

Another metric resulting from this methodology is the corrected precision of a metrology instrument, which is defined as follows:

$$\text{Corrected Precision} = \hat{\beta}\sigma_x \quad (8)$$

As defined, a smaller slope $\hat{\beta}$ implies a greater change in MSUT measurement for a given change in the RMS values. Use of a corrected precision is useful because a MSUT could exhibit a smaller (better) precision than other tools under test, yet have a larger (worse) slope. A larger slope would imply a less sensitive measurement tool, while on the other hand, a smaller precision would indicate a more resolute measurement capable of being sensitive to small changes. The product of these two estimates acts as a balance for the raw, uncorrected, precision. Therefore, for an equivalent corrected precision of two different MSUTs, a system with a smaller estimated slope $\hat{\beta}$ can accommodate a larger precision $\sigma_x$ to yield an equivalent corrected precision. In other words, the slope corrects the precision to correspond to the RMS calibrated scale.

As a check and balance on the corrected precision, a specification on the slope is also required. It is desirable to have a measurement system with a unity slope (i.e., slope=1) to maintain a constant offset, which varies as a function of the RMS values when the slope is not equal to one. This situation makes for a more complicated correction in a manufacturing environment.

Another parameter of the regression analysis is the estimated intercept, $\hat{\alpha}$. This parameter is dependent upon the estimated slope. As a result, the two parameters of the $1^{st}$-order regression analysis, i.e., $\hat{\alpha}$ and $\hat{\beta}$, are not statistically independent of each other. In addition, since the intercept is a value of y at x=0, it is difficult to get an intuitive meaning of its value. Instead of this parameter of the regression, another parameter called the offset is used and defined here as:

$$\text{Offset} \equiv \Delta = \bar{y} - \bar{x} \quad (9)$$

where $\bar{x}$ and $\bar{y}$ are the measurement averages of a calibration effort. This parameter is independent of the regression analysis. Recognizing this and considering that for a calibration effort on a MSUT, its measurements will be regressed against the RMS values, the offset is a reflection of the closeness of the MSUT compared to the RMS.

Another check is that the data needs to be tested to see if the x versus y relationship can be described as linear. This check is completed by considering the residual error. The residual error definition is different for the general linear regression (e.g., OLS) case compared to the Mandel case. The residual error for OLS, $d_i$, at each ordered pair of data is defined as:

$$d_i = y_i - \hat{\alpha} - \hat{\beta}x_i \quad (10)$$

where $\hat{\alpha}$ and $\hat{\beta}$ are the estimated intercept and slope, respectively, of the OLS regression. The net residual error D is the square root of the mean-squared error of these residuals and can be expressed as:

$$D^2 = \frac{\sum_{i=1}^{N} d_i^2}{N-2}. \quad (11)$$

However, this definition of the residual is not correct when the Mandel method is applied to the situation of comparing the RMS to the MSUT. The correct net residual error $D_M$ is given by:

$$D_M = \sqrt{\frac{(\lambda^2 + \hat{\beta}^2)}{(\lambda + \hat{\beta}^2)^2}D^2} \quad (12)$$

The net residual error $D_M$ is comprised of both systematic and random components of error. The method of data gathering and analysis described herein includes accessing the random component of error by replication, creating essentially a precision estimate. Given precision estimates $\sigma_x$ and $\sigma_y$ for the x (MSUT) and y (RMS) variables, respectively, it is possible to make an estimate of the input variance of the data set:

$$\text{Var(input)} = \sigma_y^2 + \hat{\beta}^2\sigma_x^2. \quad (13)$$

The slope is included in the above definition for reasons similar to its introduction into the corrected precision parameter. The ratio of the square of the Mandel net residual error $D_M$ to the input variance is a parameter that distinguishes systematic error from random error in the data set. This quantity is referred to herein as the "nonlinearity" parameter:

$$\text{Nonlinearity} = D_M^2/\text{Var(input)} \quad (14)$$

When the nonlinearity can be shown to be statistically significantly greater than unity, then the regression is revealing that the data contains significant nonlinear systematic behavior.

The invention determines a metric referred to herein as "total measurement uncertainty" (hereinafter "TMU") that summarizes, in a format directly comparable to measurement requirements, how well the MSUT measures even if its measurements are corrected by the regression slope $\hat{\beta}$ and intercept $\hat{\alpha}$. The TMU metric can be derived from the general linear regression metrics, or preferably from the Mandel metrics. In particular, TMU can be derived from the Mandel net residual error $D_M$. The Mandel net residual error $D_M$ contains contributions from the RMS uncertainty ($U_{RMS}$), the MSUT uncertainty ($U_{MSUT}$), and any nonlinearity in the relationship between measurements from these instruments. Similarly, the TMU can be derived from the net residual error D for a general linear regression, which contains contributions from the RMS uncertainty, i.e., in this case the RMS precision ($\sigma_{RMS}$), the MSUT corrected precision, and any nonlinearity in the relationship between measurements from these instruments.

Conceptually, the TMU is the net residual error ($D_M$ or D) without the contribution from the RMS uncertainty ($U_{RMS}$). TMU assigns to the MSUT measurement all other contributions. As noted above, the "RMS uncertainty" ($U_{RMS}$) is defined as the RMS precision or an independently determined RMS total measurement uncertainty ($\text{TMU}_{RMS}$). That is, in one instance, $U_{RMS}$ may simply be considered the precision of the RMS ($\sigma_{RMS}$), i.e., $\sigma_{RMS}$ is used as an estimate of the TMU for the RMS. However, where the RMS has a TMU substantially different than its precision, $TMU_{RMS}$ can be input to the ratio variable $\lambda$ (Eq. 5) for determining the Mandel net residual error $D_M$ and the TMU definition. The $TMU_{RMS}$ may be independently derived for the RMS, i.e., treating the RMS as a MSUT compared to another RMS. Based on above, TMU for a Mandel linear regression can be defined as:

$$TMU = \sqrt{D_M^2 - U_{RMS}^2} \quad (15)$$

where $D_M$ is the Mandel net residual error. Similarly, TMU for a general linear regression, e.g., OLS, can be defined as:

$$TMU = \sqrt{D^2 - U_{RMS}^2} \quad (16)$$

where D is the net residual error.

It should be recognized, relative to the Mandel linear regression, that when the corrected precision of the MSUT is initially used as the MSUT uncertainty ($U_{MSUT}$) to calculate ratio variable $\lambda$, the subsequently determined TMU value for the MSUT from Eq. 15, in some cases, may be substantially different from the corrected precision for the MSUT (i.e., $U_{MSUT}$). In this case, the linear regression may be repeated with the determined TMU value substituted for the corrected precision of the MSUT in the definition of the ratio variable $\lambda$ (Eq. 5). Similarly, when the subsequently determined TMU for the MSUT is still substantially different from the MSUT uncertainty used, the linear regression may be repeated with each new estimate of the TMU substituted for the MSUT uncertainty ($U_{MSUT}$) in the ratio variable $\lambda$ (Eq. 5) until sufficient convergence of the MSUT uncertainty ($U_{MSUT}$) and TMU is achieved to declare a self-consistent result.

It should also be recognized that, depending upon the skill with which this method is executed and the nature of the measurement techniques used by the two systems, there may be an undesirable contribution from the artifact itself. Properly designed applications of this method should minimize or eliminate this contribution.

TMU provides a more correct estimate of the MSUT uncertainty than the precision estimate alone because it addresses the case where there are errors due both to precision and accuracy. In contrast, the Mandel linear regression method alone addresses situations where both variables are only subject to the instrument precisions. Accordingly, TMU is a more objective and comprehensive measure of how the MSUT data deviates from the ideal behavior that would generate a straight-line SL plot in FIG. 1, or the inability of the MSUT to measure accurately. It should be recognized, however, that there are differences between TMU and what is generally considered as measurement error, i.e., the quadratic sum of all possible sources of random and systematic error contributions. In particular, systematic errors due to magnification calibration errors and offset errors are not included in the TMU since, in principle, these can be reduced to arbitrarily small contributions given sufficient attention to calibration. TMU represents the limit of what can be achieved for the given type of measurement if sufficient attention is paid to calibration. As a consequence, it represents a measure of the intrinsic measurement worth of the system.

II. Assessment Method

With reference to FIGS. 2-6, a method and program product for assessing a measurement system under test (MSUT) will be described.

Figure 2A:
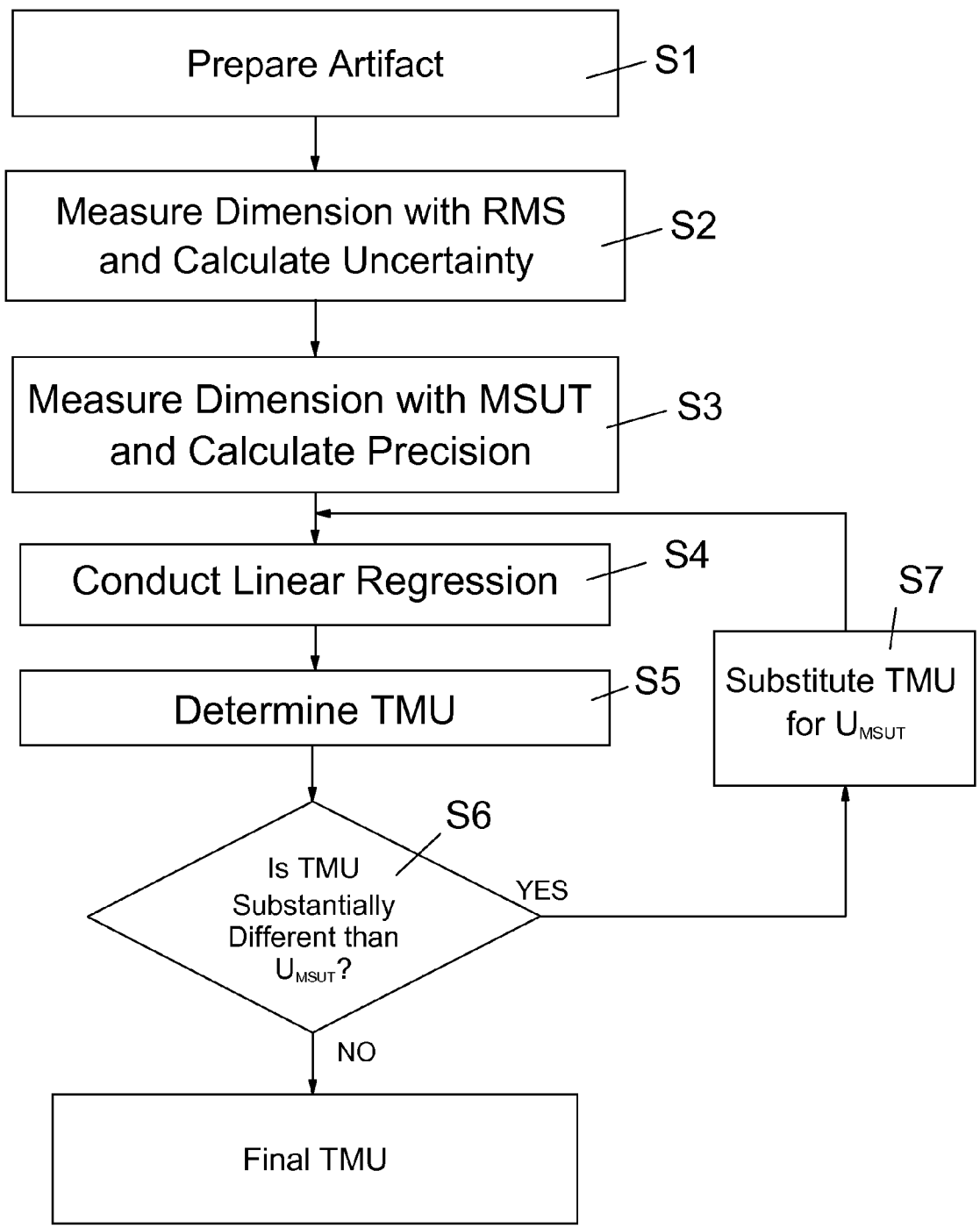
FIGS. 2A-B show flow diagrams of assessment method embodiments of the invention.

Referring to FIG. 2A, a flow diagram of a method for assessing a MSUT according to a first embodiment is shown.

Figure 3:
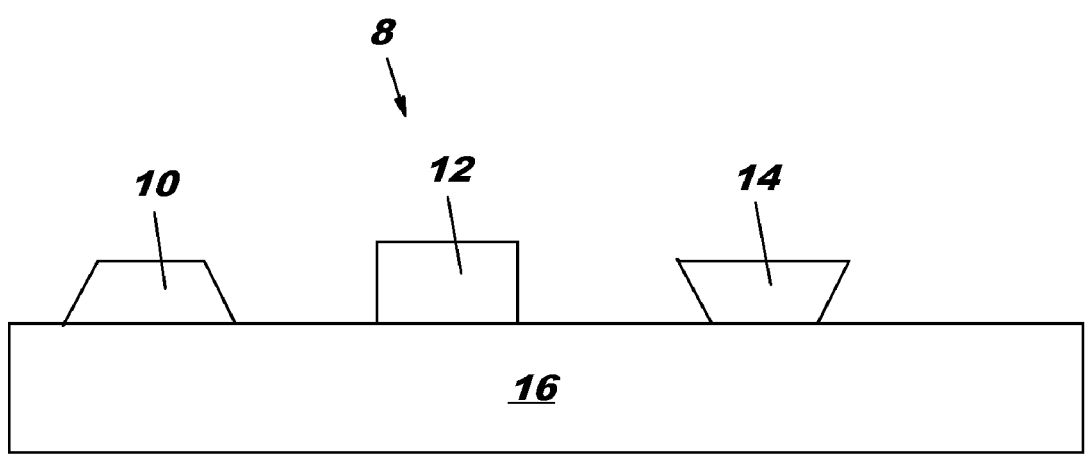
FIG. 3 shows multiple cross-sectional views of an artifact for measurement.

In a first step S1, an artifact for use in assessing the MSUT is prepared. With reference to FIG. 3, "artifact" as used herein shall refer to a plurality of structures 8 provided on a substrate 16. An artifact is generated to represent variations in a particular semiconductor process of interest for the particular MSUT. In one embodiment, an artifact may be process-stressed samples derived from actual product. FIG. 3 illustrates exemplary structures for a particular process including: an under-exposed structure 10, an ideal structure 12 (referred to as the "process of record" (POR) structure), and an over-exposed undercut structure 14. Artifact 8 should be constructed to include a fair representation of all of the various scenarios that can arise during manufacturing. The types of artifact provided may vary drastically based on, for example, the type of measurement needing assessment, the manufacturing processes that alter the measurement, and measurement parameters that alter the measurement such as temperature, probe damage, manufactured product structure or materials, etc.

Returning to FIG. 2A, at step S2, a critical dimension of artifact 8 (FIG. 3) is measured using a reference measurement system (RMS) to generate an RMS data set. The dimension may include, for example, at least one of line width, depth, height, sidewall angle, top corner rounding or any other useful dimension. The RMS is any measuring system that is trusted within a particular industry or manufacturing process. The measurement step includes characterizing the artifact(s) and producing documentation detailing structure location and reference values. As part of this step, an RMS uncertainty ($U_{RMS}$) is calculated. This calculation may include calculation of an RMS precision ($\sigma_{RMS}$) according to any now known or later developed methodology, e.g., a standard deviation analysis. Alternatively, this calculation may include calculating a $TMU_{RMS}$ according to the methods disclosed herein. That is, the RMS may be treated as an MSUT and compared to another RMS.

At step S3, the same dimension is measured using the MSUT to generate an MSUT data set. This step includes conducting a long-term reproducibility (precision) study of the MSUT according to any now known or later developed methodology. As part of this step, a MSUT precision $\sigma_{MSUT}$ from the MSUT data set is also calculated according to any now known or later developed methodology, e.g., a standard deviation analysis.

Referring again to FIG. 1, a plot of data measured by an MSUT in the form of a CD SEM versus an RMS in the form of an AFM is shown. As discussed in the data analysis section above, if a MSUT is a perfect measuring tool, the data sets should generate a straight line (SL in FIG. 1) when plotted against one another, i.e., y=x. That is, the line should have unity slope and an intercept at 0 as generated by identical data points. However, a MSUT is never a perfect measuring tool because it and the artifact are subject to the myriad of process variations. In most instances, a 0 intercept or unity slope are unlikely and, even worse, may have peaks or curvature in the data. All of this represents inaccuracy in the MSUT.

Steps S4-S5 (FIG. 2A) represent calculations of a total measurement uncertainty (TMU) of the MSUT according to the above-described data analysis. In a first part, step S4, a Mandel linear regression, as discussed above, of the MSUT and RMS data sets is conducted. The Mandel linear regression produces the parameters of slope, net residual error of the MSUT (i.e., the MSUT data set compared to the RMS data set), corrected precision of the MSUT and average offset.

Next, at step S5, TMU is determined according to the formula:

$$TMU = \sqrt{D_M^2 - U_{RMS}^2} \quad (17)$$

where $D_M$ is the Mandel net residual error (Eq. 12) and $U_{RMS}$ is the RMS uncertainty, i.e., the RMS precision ($\sigma_{RMS}$) or an independently determined $TMU_{RMS}$. In other words, a TMU for the MSUT is determined by removing the RMS uncertainty ($U_{RMS}$) from the net residual error $D_M$.

At step S6, a determination is made as to whether the determined TMU is substantially different from the MSUT uncertainty ($U_{MSUT}$). In a first cycle of steps S4-S5, the MSUT uncertainty is the corrected precision. In subsequent cycles, the MSUT uncertainty is a previously determined TMU value of the MSUT. If step S6 results in a YES, as discussed above, the Mandel linear regression may be repeated with the previously determined TMU value substituted for the MSUT uncertainty (step S7) ($U_{MSUT}$) in the ratio variable λ (Eq. 5). The Mandel linear regression analysis is preferably repeated until a sufficient convergence of the MSUT uncertainty ($U_{MSUT}$) and TMU is achieved to declare a self-consistent result. What amounts to "sufficient convergence" or "substantially different" can be user defined, e.g., by a percentage.

If the determination at step S6 is NO, then the determined TMU value is considered the final TMU for the MSUT, i.e., sufficient convergence has occurred. Based on the final TMU, an objective assessment of the MSUT is achieved.

Figure 2B:
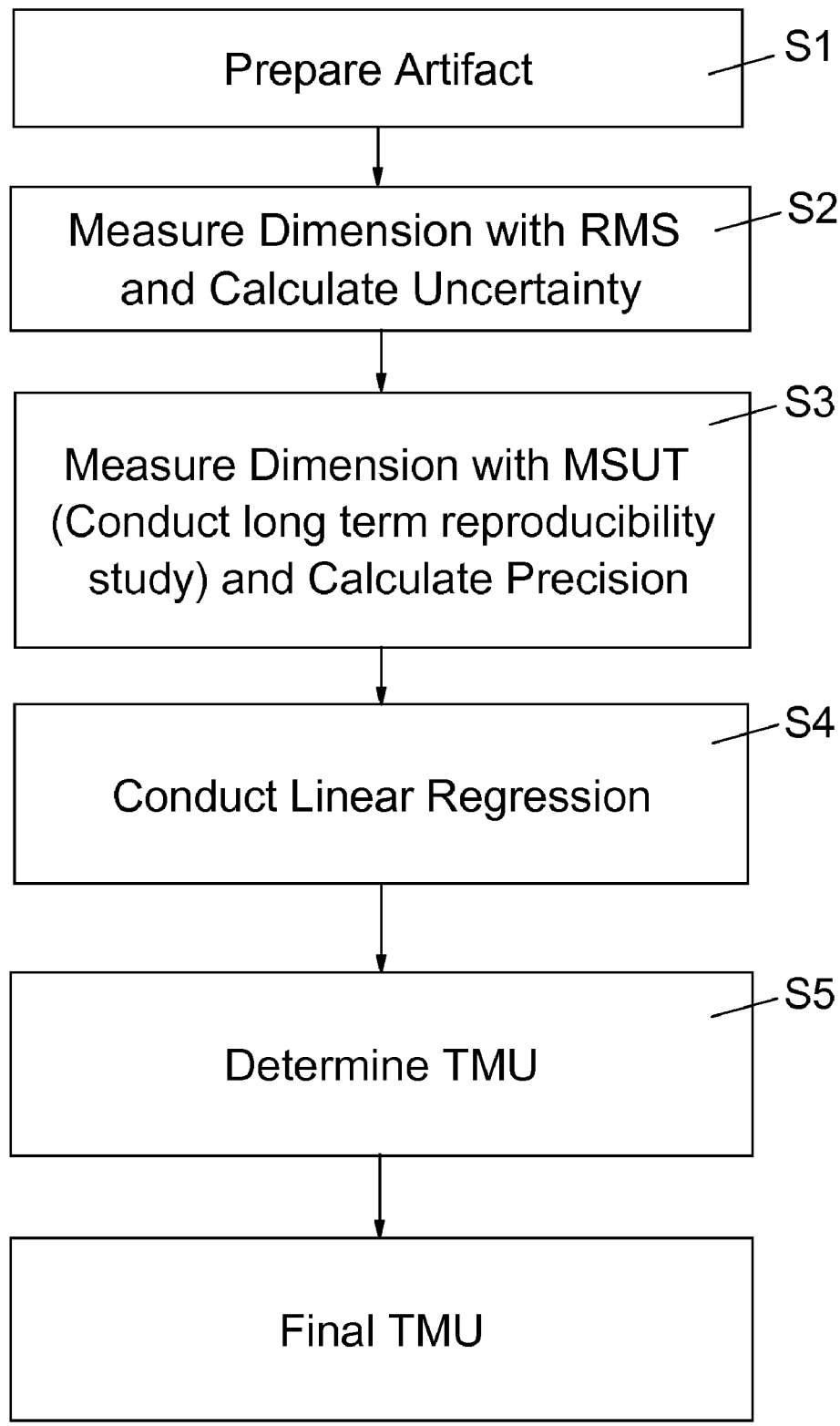

Referring to FIG. 2B, a flow diagram of a method for assessing a MSUT according to a second embodiment is shown. This embodiment is substantially similar to the embodiment of FIG. 2A, except that the linear regression can be any general linear regression, e.g., an OLS. In this case, the TMU is defined according to the formula:

$$TMU = \sqrt{D^2 - U_{RMS}^2} \quad (18)$$

where D is the net residual error (Eq. 11) and $U_{RMS}$ is the RMS uncertainty, i.e., the RMS precision ($\sigma_{RMS}$) or an independently determined $TMU_{RMS}$. The determined TMU in step S5 is the final TMU.

Asessment Example

Figure 4:
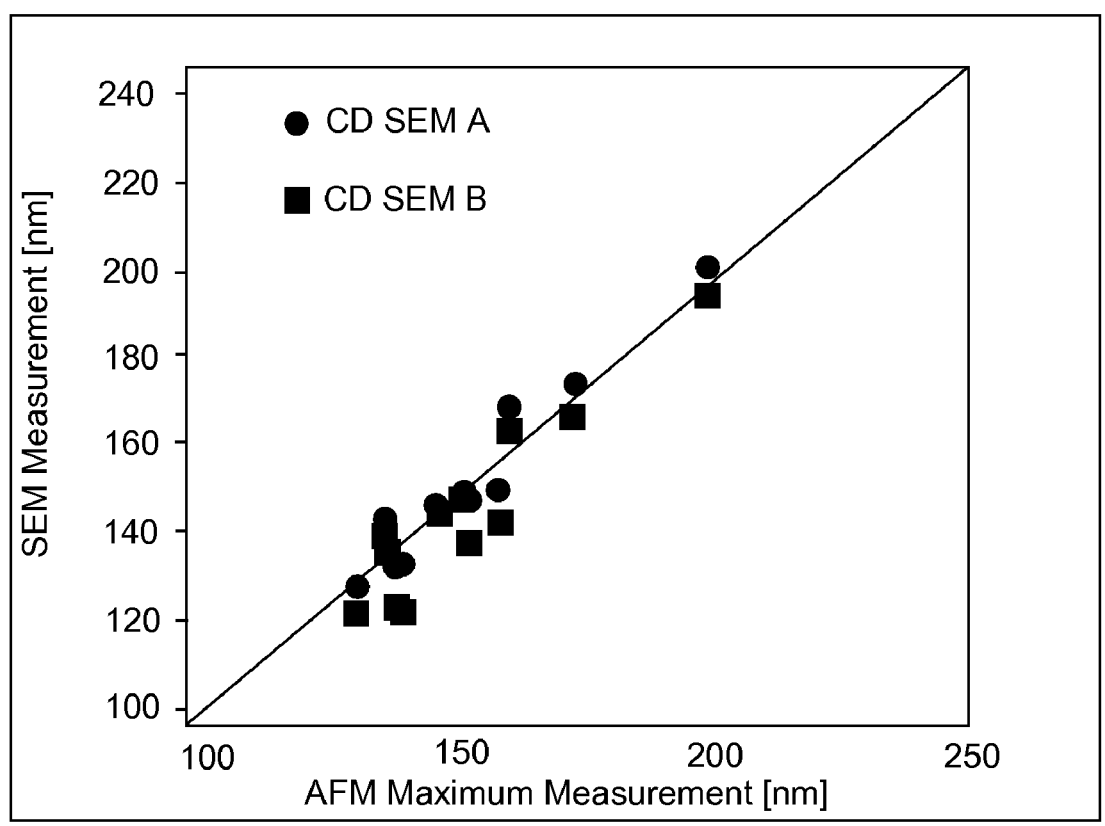
FIG. 4 shows a graph of data for a couple of CD scanning electron microscopes (SEM) under test versus an atomic force microscope (AFM) reference measurement system.

Referring to FIG. 4, a graph that compares measurements from two CD SEMs (CD SEM A and CD SEM B) to a respected RMS is shown. The artifact used was a focus and exposure matrix (FEM) wafer with the maximum dimension of an isolated line of resist as the feature of interest. This is a particularly important geometry and material because it is similar to a key semiconductor processing step that determines the speed with which transistors can switch. Hence, tighter and more accurate control at this step of manufacturing can produce more computer chips that are extremely fast and profitable. The RMS in this case was an atomic force microscope (AFM), which was trusted to determine the true CD, namely the maximum linewidth of the resist.

Ideally this data should lie along a straight line with unity slope and zero offset. The nonlinearity (Eq. 14) parameter characterizes the scatter of the data around the best-fit line. This variance of scatter is normalized so that if all of this variance is due to the random measurement variance measured by reproducibility, then the nonlinearity equals unity. In this case, CDSEM A has a nonlinearity of 100 while CDSEM B has a value of 137. Both are disturbingly large numbers. The following table derived from this data further illustrates the improved objectivity of the TMU parameter.

|         | Corrected Precision [nm] | Total Measurement Uncertainty [nm] |
|---------|--------------------------|-------------------------------------|
| CDSEM A | 1.5                      | 20.3                                |
| CDSEM B | 1.8                      | 26.1                                |

Figure 5:
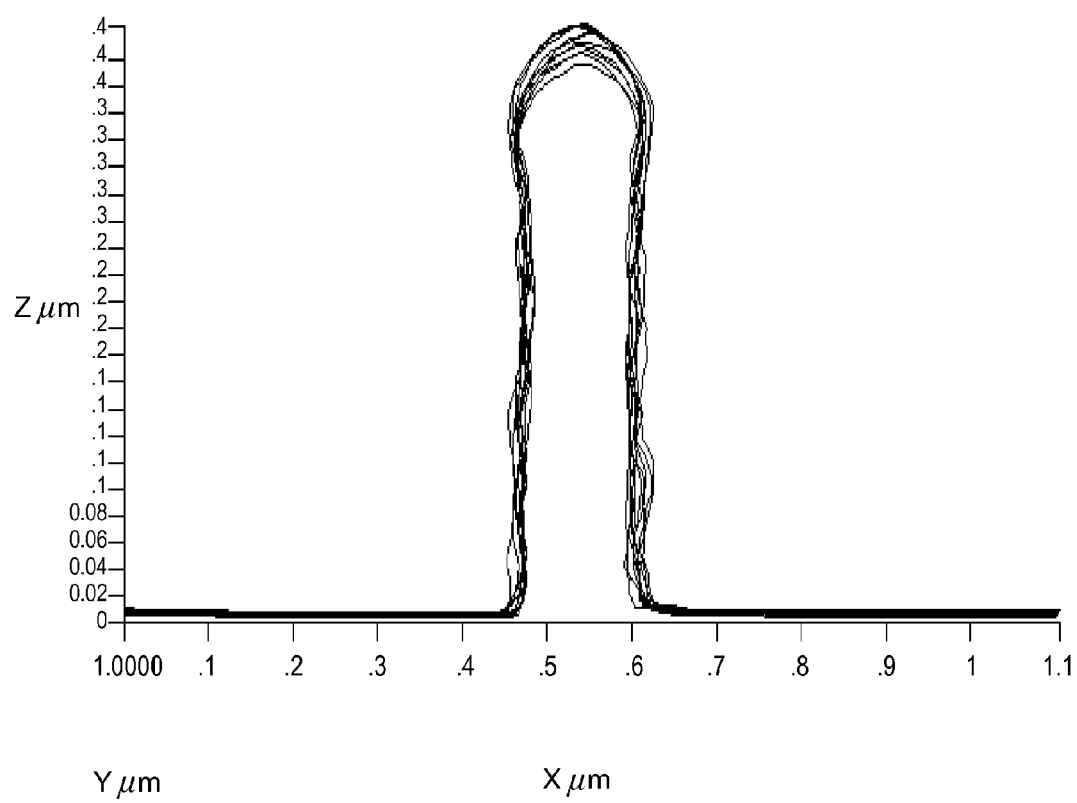
FIG. 5 shows AFM images for one feature of an artifact.
Figure 6:
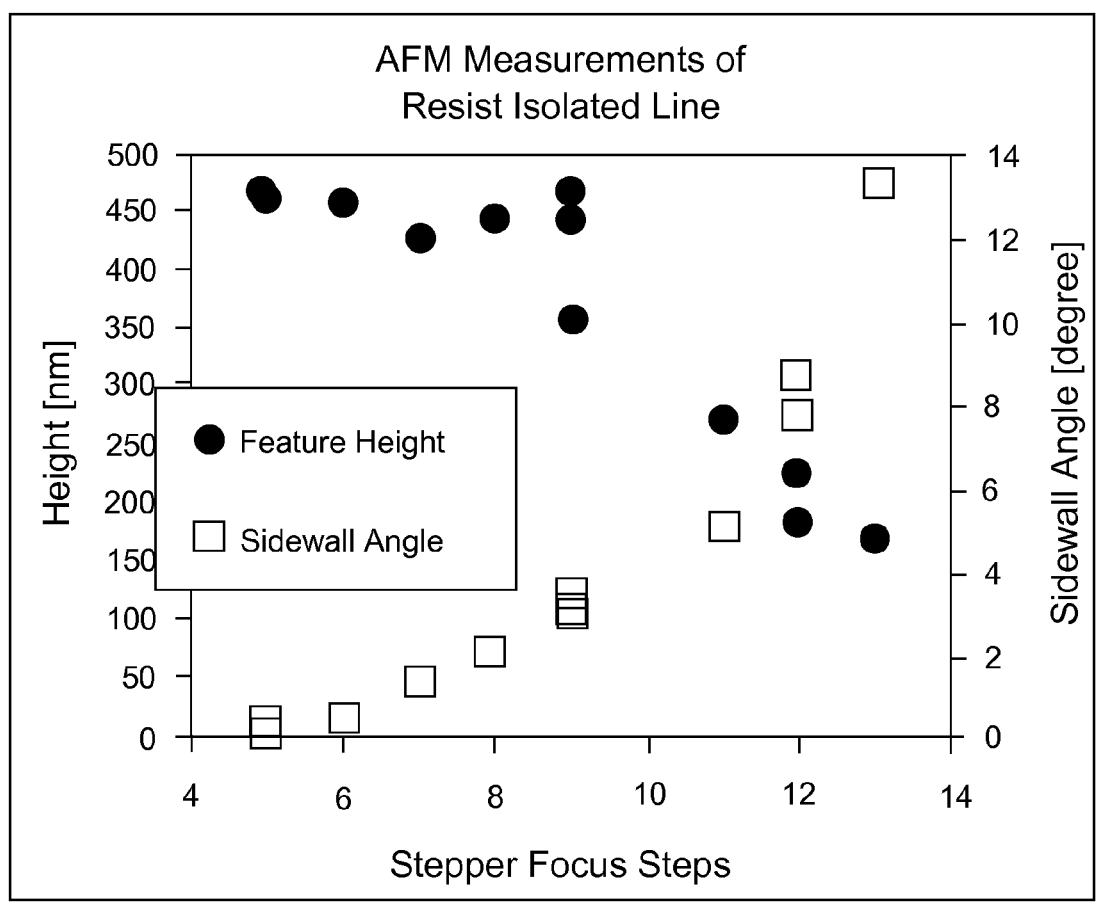
FIG. 6 shows a graph of variation in feature height and sidewall angle across the various features through photolithographic stepper focus and dose.

This example illustrates the severe discrepancy between using precision as the key roadmap parameter and TMU, which contains precision but also includes contributions from accuracy. In the particular example of the resist-isolated line, the problem is associated with severe resist loss during the printing process, which can have profound changes to the line shape, and how well the MSUT measures the desired critical dimension. FIG. 5 shows multiple AFM images for one of the features on this FEM wafer. The AFM image shows edge roughness, top corner rounding, and even undercut. Referring to FIG. 6, a graph shows the variation in feature height and sidewall angle across the FEM. On the horizontal axis is the photolithographic stepper focus setting. Across this FEM, the feature height changes by a factor of three (3). In addition, there is significant sidewall angle variation.

III. Optimization Method

An application for the above-described assessment methodology and TMU calculation lies in the optimizing of a measurement system. Conventional methods for optimizing a MSUT would seek measurement conditions and algorithm settings to minimize the precision and offset of the measurement. Minimization of TMU as described above, however, provides a more objective and comprehensive determination.

Figure 7A:
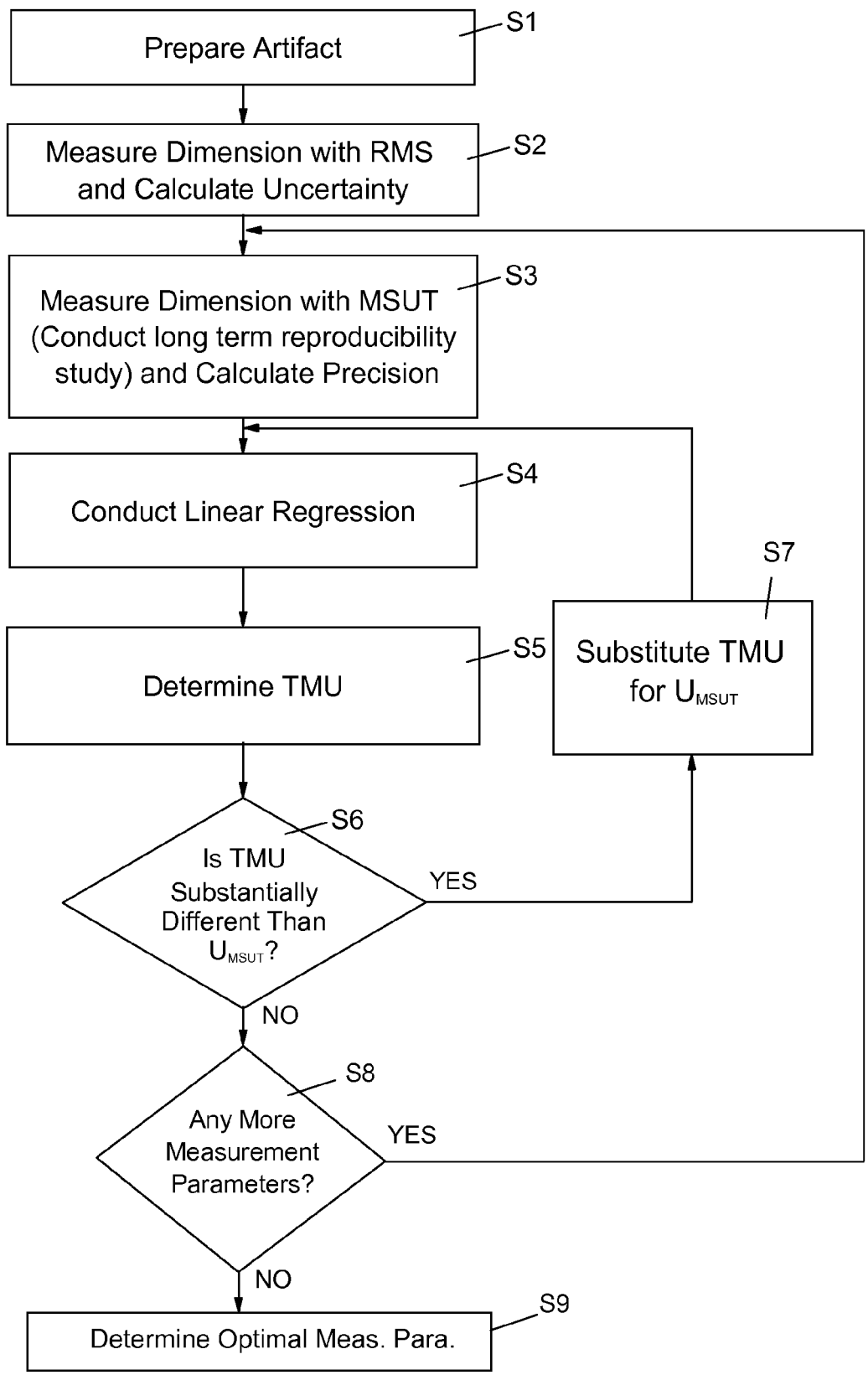
FIGS. 7A-B show flow diagrams of optimization method embodiments of the invention.

Turning to FIG. 7A, a flow diagram of a method of optimizing an MSUT according to a first embodiment is shown. In first step, S1, a structure 8 (FIG. 3), i.e., artifact, is provided as described above relative to the assessment method.

Step S2 (FIG. 7A) includes measuring a dimension of the plurality of structures according to a measurement parameter using a reference measurement system (RMS) to generate an RMS data set. A "measurement parameter" as used herein, refers to any measurement condition or analysis parameter that affects the outcome of the measurement that can be controllably altered. A "measurement parameter" may also include a combination of conditions and parameters or a variation of one of these. Measurement parameters may vary, for example, according to the type of MSUT. For example, for an SEM, a measurement parameter may include at least one of: a data smoothing amount, an algorithm setting, a beam landing energy, a current, an edge detection algorithm, a scan rate, etc. For a scatterometer, a measurement parameter may include at least one of: a spectra averaging timeframe, a spectra wavelength range, an angle of incidence, area of measurement, a density of selected wavelengths, number of adjustable characteristics in a theoretical model, etc. For an AFM, a measurement parameter may include at least one of: a number of scans, a timeframe between scans, a scanning speed, a data smoothing amount, area of measurement, a tip shape, etc. A step of selecting a measurement parameter(s) (not shown) may also be included in the optimization method. Subsequently, an RMS uncertainty ($U_{RMS}$) is calculated. This calculation may include calculation of an RMS precision ($\sigma_{RMS}$) according to any now known or later developed methodology, e.g., a standard deviation analysis. Alternatively, this calculation may include calculating a $TMU_{RMS}$ according to the methods disclosed herein. That is, the RMS may be treated as an MSUT and compared to another RMS.

In next step, S3, measurement of the same dimension of the plurality of structures according to the same measurement parameter using the MSUT is made to generate an MSUT data set. Subsequently, a precision of the MSUT from the MSUT data set is calculated.

Step S4 includes, as described above relative to the assessment method, conducting a Mandel linear regression analysis of the MSUT and RMS data sets to determine a corrected precision of the MSUT, and a net residual error for the MSUT.

Next, at step S5, TMU is determined according to the formula:

$$TMU = \sqrt{D_M^2 - U_{RMS}^2} \quad (19)$$

where $D_M$ is the Mandel net residual error (Eq. 12) and $U_{RMS}$ is the RMS uncertainty, i.e., the RMS precision ($\sigma_{RMS}$) or an independently determined $TMU_{RMS}$. In other words, a TMU for the MSUT is determined by removing the RMS uncertainty ($U_{RMS}$) from the net residual error $D_M$.

At step S6, a determination is made as to whether the determined TMU is substantially different from the uncertainty for the MSUT ($U_{MSUT}$). As noted above, in a first cycle of steps S4-S5, the MSUT uncertainty is the corrected precision. In subsequent cycles, the MSUT uncertainty is a previously determined TMU value of the MSUT. If step S6 results in a YES, as discussed above, the Mandel linear regression may be repeated with the previously determined TMU value substituted for the MSUT uncertainty ($U_{MSUT}$) (step S7) in the ratio variable $\lambda$ (Eq. 5). The Mandel linear regression analysis is preferably repeated until a sufficient convergence of the MSUT uncertainty ($U_{MSUT}$) and TMU is achieved to declare a self-consistent result. What amounts to "sufficient convergence" or "substantially different" can be user defined, e.g., as a percentage.

If the determination at step S6 is NO, then the determined TMU is considered the final TMU for that measurement parameter, and processing proceeds to step S8.

At step S8, a determination is made as to whether another measurement parameter (e.g., CD SEM smoothing filter adjustment) exists. If step S8 results in YES, steps S3 to S7 may be repeated for another measurement parameter. The repeating step may recur for any number of measurement parameters. The resulting data includes a number of TMUs with corresponding measurement parameter(s) and/or artifact structure(s). If step S8 results in NO, processing proceeds to step S9.

Step S9 includes optimizing the MSUT by determining an optimal measurement parameter based on a minimal TMU. In particular, a minimal TMU is selected from a plurality of total measurement uncertainties of a corresponding plurality of measurement parameters. The corresponding measurement parameter represents the least imprecise and inaccurate environment for using the MSUT.

Figure 7B:
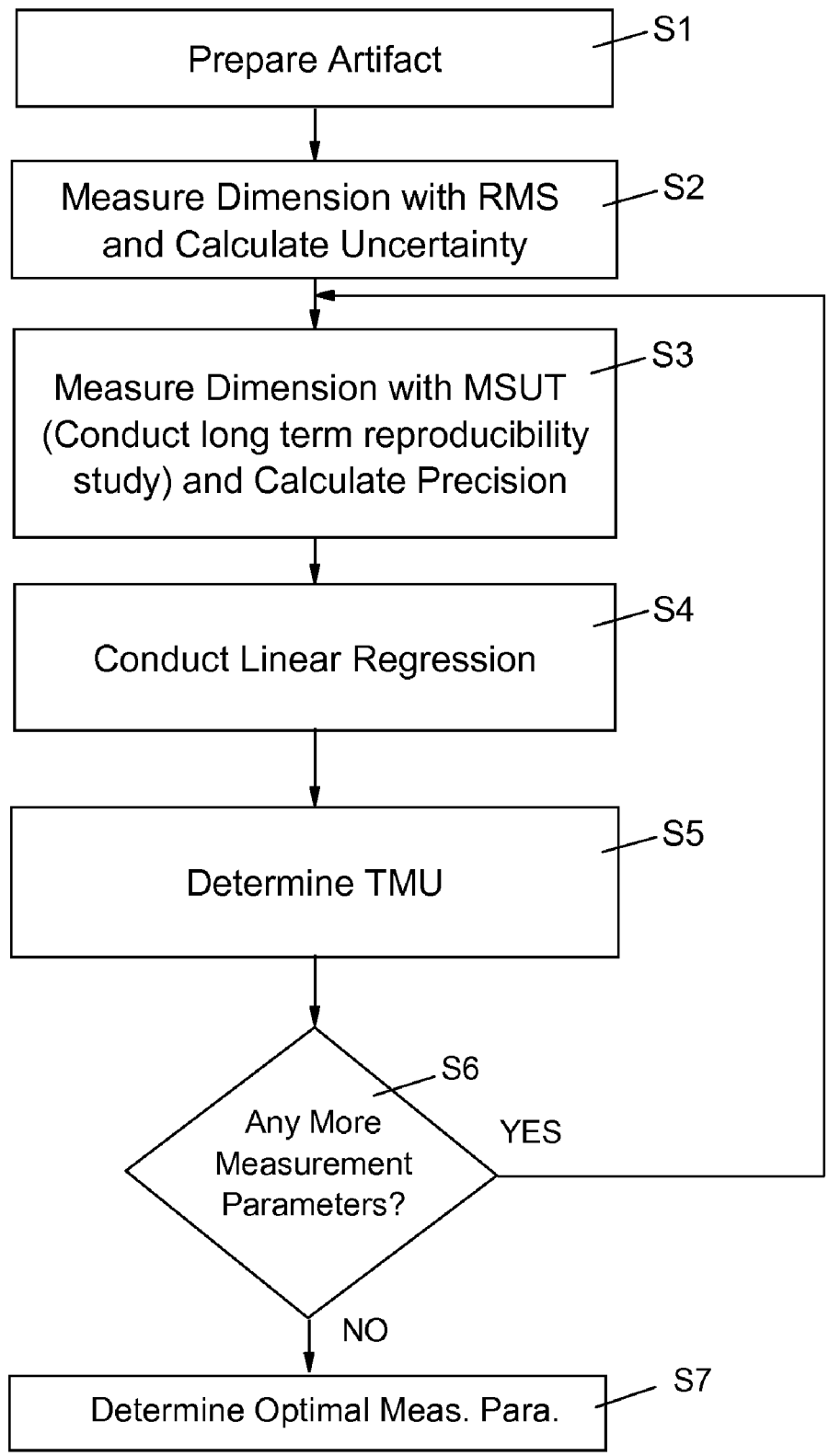

Referring to FIG. 7B, a flow diagram of a method for optimizing a MSUT according to a second embodiment is shown. This embodiment is substantially similar to the embodiment of FIG. 7A, except that the linear regression can be any general linear regression, e.g., an OLS. In this case, the TMU is defined according to the formula:

$$TMU = \sqrt{D^2 - U_{RMS}^2} \quad (20)$$

where D is the net residual error (Eq. 11) and $U_{RMS}$ is the RMS uncertainty, i.e., the RMS precision ($\sigma_{RMS}$) or an independently determined $TMU_{RMS}$. In addition, the determined TMU for a measurement parameter in step S5 is considered the final TMU for that particular measurement parameter. Step S6 and S7 are identical to steps S8 and S9 relative to the description of FIG. 7A.

Optimization Example

Figure 8:
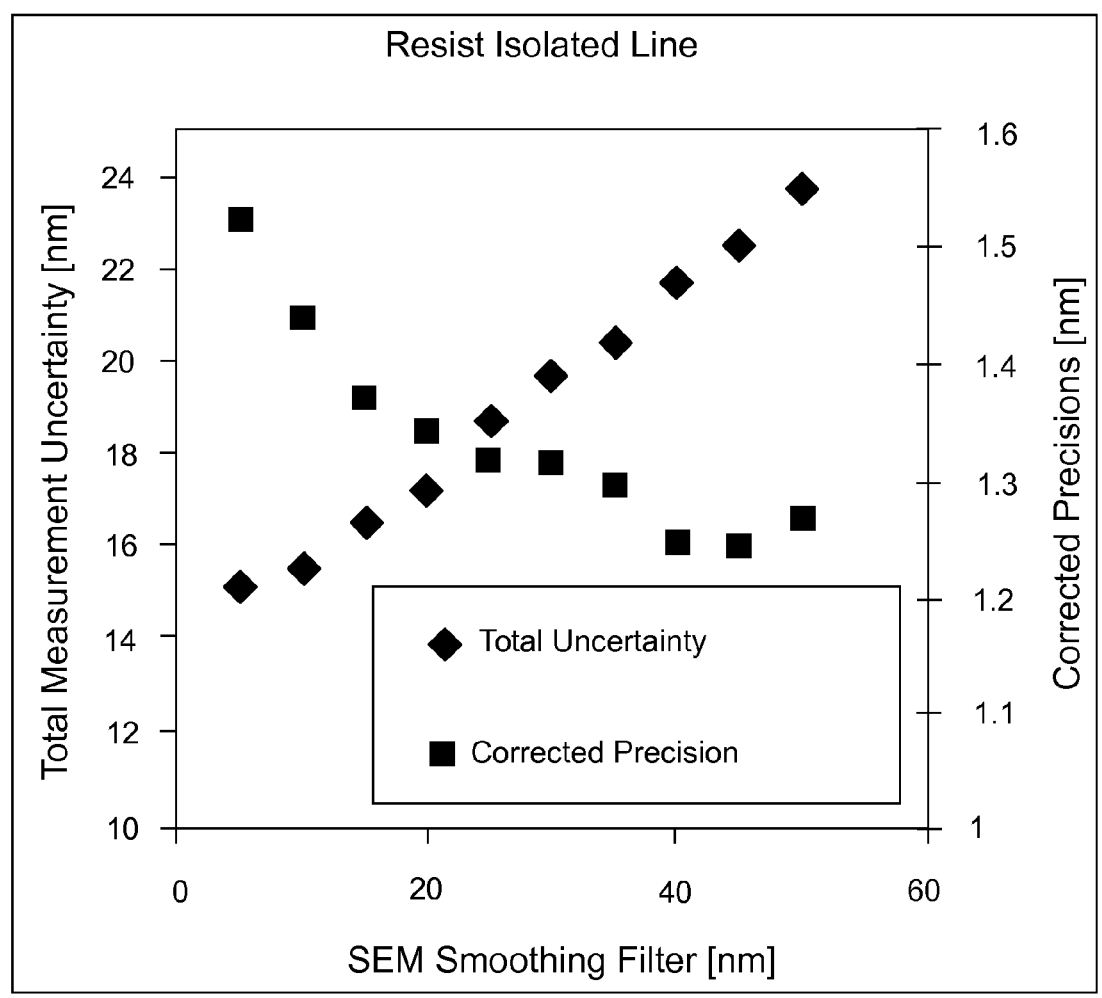
FIG. 8 shows a graph of total measurement uncertainty and corrected precision versus an amount of SEM data smoothing from the optimization process shown in FIGS. 7A-B.

Referring to FIG. 8, an example derived from optimizing measurement conditions on a CDSEM for a resist isolated line geometry is graphically illustrated. The CD SEM starting conditions were those of one of the CD SEMs discussed earlier. While several acquisition conditions and algorithms settings were optimized in this investigation, the graph shown in FIG. 8 illustrates the consequences of changing the amount of smoothing done to the raw CD SEM waveform prior to further algorithm analysis. In particular, the noise reduction from this smoothing has a positive effect upon reducing the corrected precision. However, from the point of view of TMU, the trend is opposite. This suggests that the loss of accuracy in tracking the process changes in the artifact is worse with greater smoothing as evidenced by this trend dominating the TMU.

IV. Conclusion

Although particular embodiments of assessment and optimization methods have been described above, it should be recognized that particular steps may be omitted or varied. Accordingly, the invention should not be limited to any particular embodiment other than as provided in the attached claims.

In the previous discussion, it will be understood that the method steps discussed may be performed by a processor executing instructions of program product stored in a memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

Industrial Applicability

The invention is useful for assessing and optimizing a measurement system under test.

What is claimed is:

1. A computer program product comprising a computer useable medium having computer readable program code embodied therein for assessing a measurement system under test (MSUT), the program product comprising:
   (a) program code configured to measure a dimension of the plurality of structures using a reference measurement system (RMS) to generate a first data set, and calculate an RMS uncertainty ($U_{RMS}$) from the first data set, where the RMS uncertainty ($U_{RMS}$) is defined as one of an RMS precision and an independently determined RMS total measurement uncertainty ($TMU_{RMS}$);
   (b) program code configured to measure the dimension of the plurality of structures using the MSUT to generate a second data set, and calculate a precision of the MSUT from the second data set;
   (c) program code configured to conduct a linear regression analysis of the first and second data sets to determine a corrected precision of the MSUT and a net residual error;
   (d) program code configured to determine a total measurement uncertainty (TMU) for the MSUT by removing the RMS uncertainty ($U_{RMS}$) from the net residual error; and
   (e) program code configured to output the TMU to a system capable of optimizing the MSUT.

2. The program product of claim 1, wherein the code configured to determine the TMU implements the formula:

$$TMU = \sqrt{D^2 - U_{RMS}^2}$$

where D is the net residual error.

3. The program product of claim 1, wherein the code configured to conduct the linear regression implements a Mandel linear regression wherein a ratio variable $\lambda$ is defined according to the formula:

$$\lambda = \frac{U_{RMS}^2}{U_{MSUT}^2}$$

where $U_{MSUT}$ is as an MSUT uncertainty defined as one of the corrected precision of the MSUT and the TMU for the MSUT.

4. The program product of claim 3, further comprising program code configured to, in the case that the TMU for the MSUT is substantially different than the MSUT uncertainty ($U_{MSUT}$), re-running the program code configured to conduct a linear regression analysis and the program code configured to determine TMU using the TMU for the MSUT as the MSUT uncertainty ($U_{MSUT}$) in determining the ratio variable $\lambda$.

5. The program product of claim 3, wherein the code configured to determine the TMU implements the formula:

$$TMU = \sqrt{D_M^2 - U_{RMS}^2}$$

where $D_M$ is the Mandel net residual error.

6. A computer program product comprising a computer useable medium having computer readable program code embodied therein for optimizing a measurement system under test (MSUT), the program product comprising:
   (a) program code configured to measure a dimension of a plurality of structures according to a measurement parameter using a reference measurement system (RMS) to generate a first data set, and calculate an RMS uncertainty ($U_{RMS}$) from the first data set, where the RMS uncertainty ($U_{RMS}$) is defined as one of an RMS precision and an independently determined RMS total measurement uncertainty ($TMU_{RMS}$);
   (b) program code configured to measure the dimension of the plurality of structures according to the measurement parameter using the MSUT to generate a second data set, and calculate a precision of the MSUT from the second data set;
   (c) program code configured to conduct a linear regression analysis of the first and second data sets to determine a corrected precision of the MSUT and a net residual error;
   (d) program code configured to determine a total measurement uncertainty (TMU) for the MSUT by removing the RMS uncertainty (URMS) from the net residual error;
   (e) program code configured to output the TMU to a system capable of optimizing the MSUT; and
   (f) program code configured to optimize the MSUT by determining an optimal measurement parameter based on a minimal total measurement uncertainty selected from a plurality of total measurement uncertainties of a corresponding plurality of measurement parameters.

7. The program product of claim 6, wherein the code configured to determine the TMU implements the formula:

$$TMU = \sqrt{D^2 - U_{RMS}^2}$$

where D is the net residual error.

8. The program product of claim 6, wherein the code configured to conduct the linear regression implements a Mandel linear regression wherein a ratio variable $\lambda$ is defined according to the formula:

$$\lambda = \frac{U_{RMS}^2}{U_{MSUT}^2}$$

where $U_{MSUT}$ is as an MSUT uncertainty defined as one of the corrected precision of the MSUT and the TMU for the MSUT.

9. The program product of claim 8, further comprising program code configured to, in the case that the TMU for the MSUT is substantially different than the MSUT uncertainty ($U_{MSUT}$), re-running the program code configured to conduct a linear regression analysis and the program code configured to determine TMU using the TMU for the MSUT as the MSUT uncertainty ($U_{MSUT}$) in determining the ratio variable $\lambda$.

10. The program product of claim 8, wherein the code configured to determine the TMU implements the formula:

$$TMU = \sqrt{D_M^2 - U_{RMS}^2}$$

where $D_M$ is the Mandel net residual error.

* * * * *